United States Patent [19]

Schirbl et al.

[11] Patent Number: 5,067,785
[45] Date of Patent: Nov. 26, 1991

[54] ELECTRONIC MODULES

[75] Inventors: Reinhard Schirbl, Schwandorf; Günther Deinhardt; Hermann Kasowski, both of Amberg, all of Fed. Rep. of Germany

[73] Assignee: Siemens Aktiengesellschaft, Berlin & Munich, Fed. Rep. of Germany

[21] Appl. No.: 586,568

[22] Filed: Sep. 21, 1990

[30] Foreign Application Priority Data

Sep. 25, 1989 [EP] European Pat. Off. ............ 89117654

[51] Int. Cl.⁵ .................................................. G02B 6/00
[52] U.S. Cl. ...................................... 385/38; 385/92; 385/147
[58] Field of Search ............... 350/96.10, 96.15, 96.17, 350/96.20; 250/227.14, 227.15, 227.17, 227.24, 552; 357/17, 19, 30, 74, 80

[56] References Cited

U.S. PATENT DOCUMENTS

| 4,705,960 | 11/1987 | Lovrenich | 350/96.10 X |
| 4,826,274 | 5/1989 | Diamantstein et al. | 350/96.10 X |
| 4,913,526 | 4/1990 | Hediger | 350/96.10 X |

FOREIGN PATENT DOCUMENTS 1257680 7/1989 Canada .

*Primary Examiner*—William L. Sikes
*Assistant Examiner*—Phan T. Heartney
*Attorney, Agent, or Firm*—Kenyon & Kenyon

[57] ABSTRACT

An electronic module includes a front fin, a printed circuit board having connected terminals, a status display including a plurality of fiber optic guides which lead into the fin and serve as light-emitting elements, a front panel connector, and a front door attached to the front panel connector. The fin may include a bar on a housing shell which projects to the front side and of a counterpart bar on a housing cover. The plurality of fiber optic guides may be combined into one fiber optic comb. A swivel may be used to connect the front panel connector to the module. Flexible hinges may be used to connect the front door to the front panel connector and to mount the light-emitting elements to the printed circuit board.

20 Claims, 5 Drawing Sheets

ELECTRONIC MODULES

BACKGROUND OF THE INVENTION

The present invention relates generally to electronic modules and, more particularly, to an electronic module or an improved electronic module having optical wave guides and unique front panel construction to provide a module with smaller width.

Published utility document G 84 15 458 discloses an electronic module having a printed-circuit board which is provided with connecting terminals, a front door, a status display which is present on a fin on the front side, and a front panel connector which has a cable channel for receiving cables which can be electronically connected to leads on the printed circuit board via connecting terminals. The front door is attached to the front side of the fin and this attachment configuration requires a correspondingly wide fin which is not desirable as it affects the width of the module. The width of the protruding fins in present modules also has been related to providing accommodations for light-emitting diodes provided for status display and their mounting support. Other drawbacks from this known configuration stem from the fact that to remove the front panel connector the front door must first be opened. While handling the front panel connectors, the front door is then obstructive, and there is the danger that closely neighboring, opened front doors may become damaged.

Thus, in view of the disadvantages of the electronic module of the general type discussed above, it is desirable to effectively reduce the width of the module; to reduce damage to the front door of the module; to effectively decrease the amount of obstruction resulting from an opened front door; and to reduce its potential for damaging neighboring, opened front doors.

SUMMARY OF THE INVENTION

The present invention obviates the problems of the electronic module published in the German utility document by providing an electronic module with a smaller width. The front door is attached to the front panel connector, and fiber optic guides which lead into the fin and which serve as extension elements from light-emitting elements are used for the status display. By attaching the front door to the front panel connector, this front panel connector is also designed as a closed unit on the front side. Damage to the front door occurs less frequently because it is attached to the front panel connector rather than to a fin of the module.

The use of a fiber optic guide, which serves to transmit the light emitted by a light-emitting element, is advantageous with regard to the voltage endurance to be maintained in the face of electrostatic discharges from modules which are attached on the front side to electronics in the module. Furthermore, if several fiber optic guides are combined into one fiber optic comb, then the expenditure of energy required during manufacture in order to secure the fiber optic guide within the fin is thereby reduced.

Automated manufacture of the module of the present invention is possible when the module is constructed from a housing shell with a positioning element for positioning the printed-circuit board with the module, together with a housing cover. The present invention has proved additionally advantageous when the fin is formed by a first bar which protrudes on a front side from the housing shell and by a counterpart bar which extends from the housing cover.

A combination of a swivel bearing and a swivel mount secures the front panel connector to the module as well as permits contacting the connecting terminals of the module with meters or other measuring equipment.

While manufacturing the module, care should be taken that the fiber optic guides are not allowed to slip out of place after they have been inserted into the fin. This can be achieved in a simple manner by providing a latching mechanism to latch the fiber optic guides into place. Light-emitting diodes may be used as light-emitting elements. Usually, light-emitting diodes may be secured in the module by a retainer which offers mechanical protection for the diode. The retainer for mounting the light-emitting diodes may be provided with a first flexible hinge. This makes it possible to align the light-emitting diodes via the flexible joint such that a certain point is illuminated, whereby the location for fastening the retainer can be selected relatively freely.

The front panel connector may be provided with a coding element to prevent the erroneous connection of an inappropriate front panel connector to a module in a simple manner.

Attachment of the module to a printed circuit board (PCB) rack may be accomplished by providing the module with a threaded bolt. The width of the front panel connector may be reduced by providing a second flexible hinge to secure the front door to the front panel connector.

DETAILED DESCRIPTION

Figure 1:
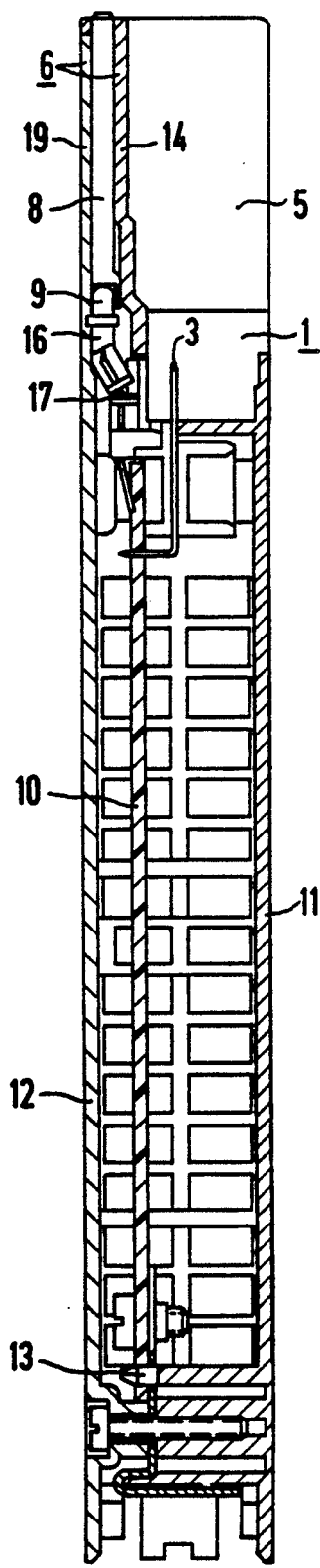
FIG. 1 is a cross-sectional view through a module constructed according to an embodiment of the present invention.

FIG. 1 illustrates a cross-section through a module with a fin or wing according to an embodiment of the present invention. Module 1 includes a housing shell 11 with positioning mechanism 13 which positions the printed circuit board (PCB) 10, as well as a housing cover 12 which lies opposite the housing shell 11 on the other side of the printed-circuit board 10. This module design, for which automated assembly process is provided, is more closely described in a corresponding U.S. patent application entitled: "Modules for Connection to a Mounting Rack" the disclosure of which is herein incorporated by reference.

Figure 3:
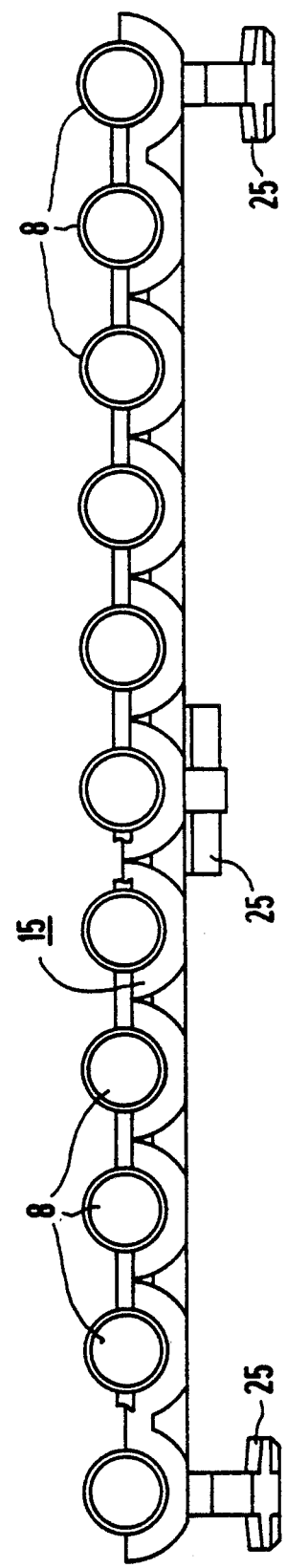
FIG. 3 is a view of a fiber optic comb constructed according to another embodiment of the present invention.

The protruding fin 6 of module 1 is formed by a first bar 14, which is an extended portion of the body of the housing shell 11, as well as by a counterpart bar 19 which, as part of the housing cover 12, runs parallel to the first bar 14 and matches that first bar. Fiber optic guides 8 having two ends are accommodated within the fin 6. A first end of the guide 8 is provided at the end of the fin 6 and the second end of the guide 8 leads to light-emitting diode 9. To simplify the manufacturing process, several fiber optic guides 8 may be combined into one fiber optic comb 15, a ridged structure in which the optic guides are placed, as illustrated in FIG. 3. A diminished thickness of the fiber optic guides 8 at the end results in the fin 6 having a very narrow design in this region. The fin has a broadened region near the second end of the guides to receive the considerably wider light-emitting diodes 9. This design contributes to a narrower type of construction of the module 1.

To mount the light-emitting diodes 9, a retainer 16 is provided with a flexible hinge 17 by way of which the light-emitting diode 9 can be brought into a position which is close to the fiber optic guide 8 by bending it around. This proves especially convenient with regard to an automated manufacturing process of the module 1 since in this manner, a hard-soldering of the light-emitting diodes 9 to the printed-circuit board 10, together with a hard-soldering of the remaining components to the same printed circuit board 10 can be undertaken in a soldering bath, prior to bending the retainer 16. Only after the light-emitting diode 9 has been soldered is the retainer 16 moved along the flexible hinge 17 into its final position for insertion into the module 1.

Figure 5:
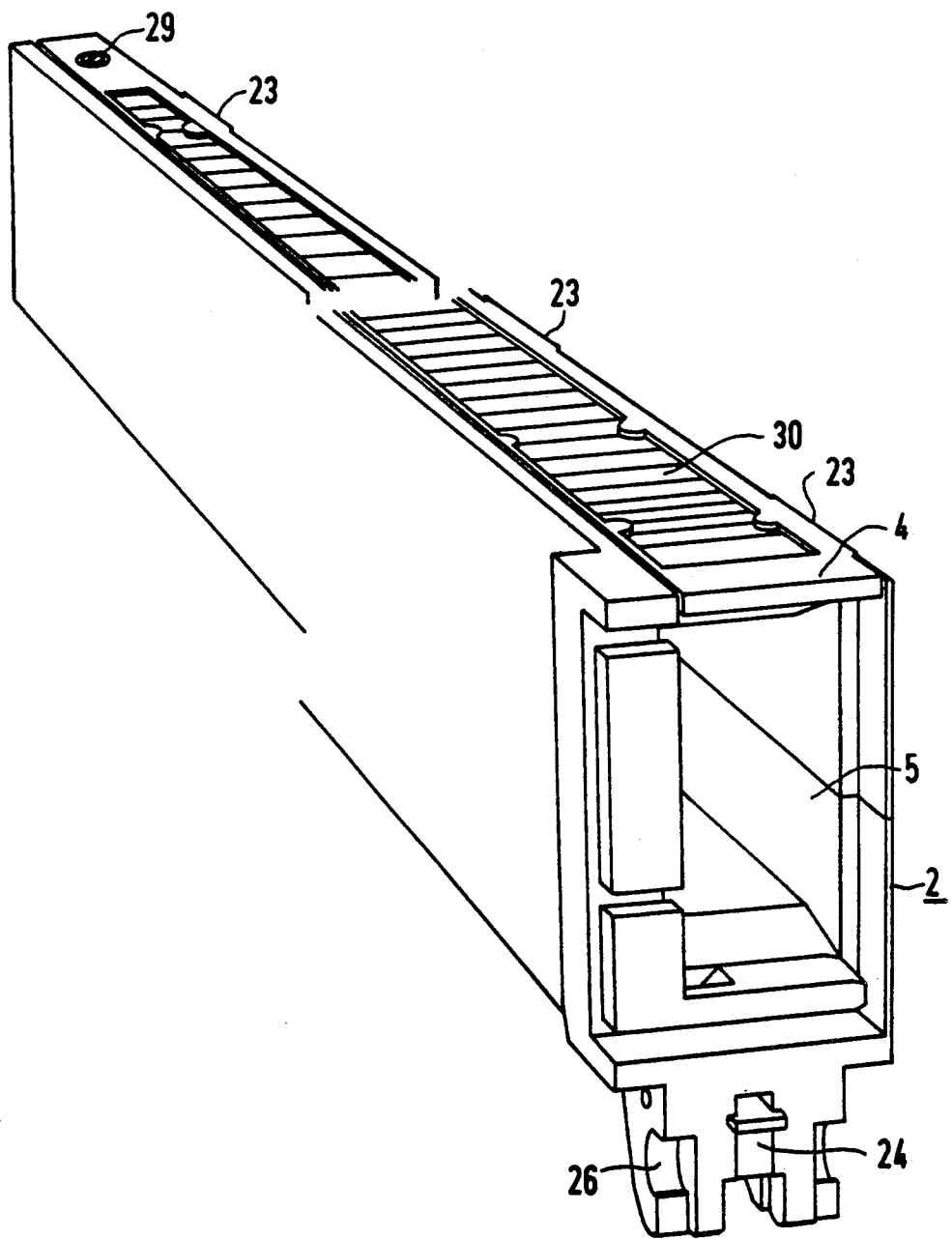
FIG. 5 is a partial view of the front panel connector including a swivel mount and a coding element constructed according to another embodiment of the present invention.

In addition to the fin 6, the front panel connector 2 illustrated in FIG. 5 is provided. The front panel connector 2 has a front door 4 and a cable channel 5 running parallel to a status display within the fin 6. The front door 4 is attached to the front panel connector 2 via a flexible hinge 23 which provides a further technique for reducing the width of the module 1, since in this manner, fixing agents, which attach such doors to fins in other devices and take up greater amounts of space on the module 1, can themselves be dispensed with. The front panel connector 2 has on its one end a swivel mount 26, that swivels the connector onto the module 1. The swivel mount may include a coding element 24 which is a mechanical interconnecting device which will not allow an improper front connector panel 2 to be attached to a module.

Figure 2:
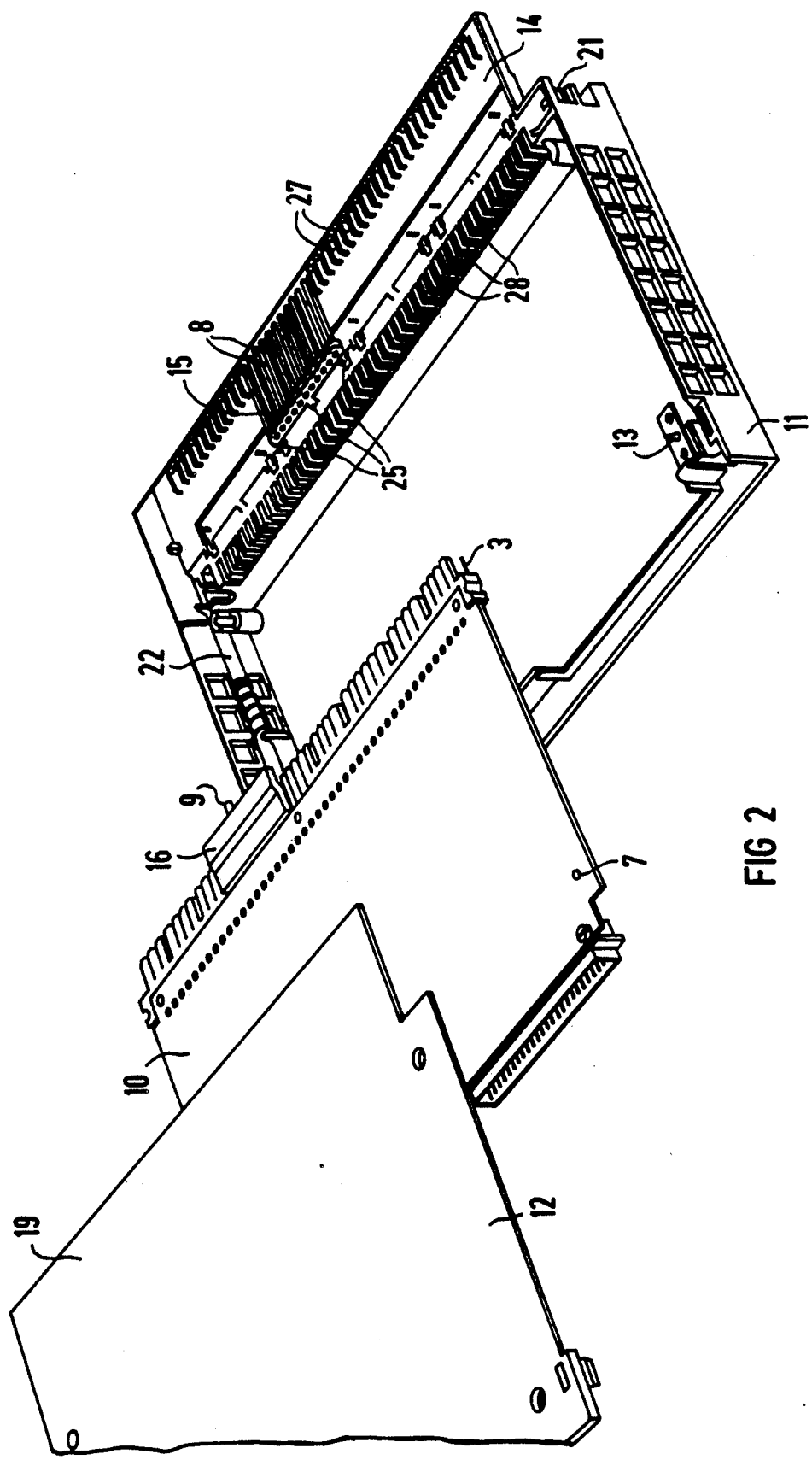
FIG. 2 is a perspective view of the disassembled module with a housing shell, a printed-circuit board and a housing cover constructed according the embodiment of the present invention of FIG. 1.

In FIG. 2, a perspective view of the disassembled module is provided. At the bottom, the housing shell 11 includes a first bar 14. A swivel bearing 21 is provided on the front side of the housing shell for coupling with swivel mount 26 of the front panel connector. A threaded bolt 22 and a peg or projection 13 serve to position the printed-circuit board 10 in the module. The inside of the first bar 14 includes grooves 27 into which the fiber optic combs 15, including fiber optic guides 8, can be secured without slippage. The fiber optic combs 15 illustrated in FIG. 3 also have a latching means 25, such that they are able to be latched into place in correspondingly constructed openings within the bar 14 of the housing shell 11. Above the housing shell 11, the PCB 10 is represented, and the PCB 10 can be provided with retainers 16 for receiving the light-emitting diodes 9. After placing the printed circuit board 10 on top of the housing shell 11, whereby the pegs 13 engage with a corresponding hole 7 of the printed circuit board 10, the module 1 is sealed by a housing cover 12, which is screwed onto the housing shell 11. Slits 28, which are provided in the bar 14, permit the connecting terminals 3 on the printed circuit board 10 to penetrate through to the outside in order to make possible the electrical connection to cables in the cable channel 5 of the front panel connector 2.

Figure 4:
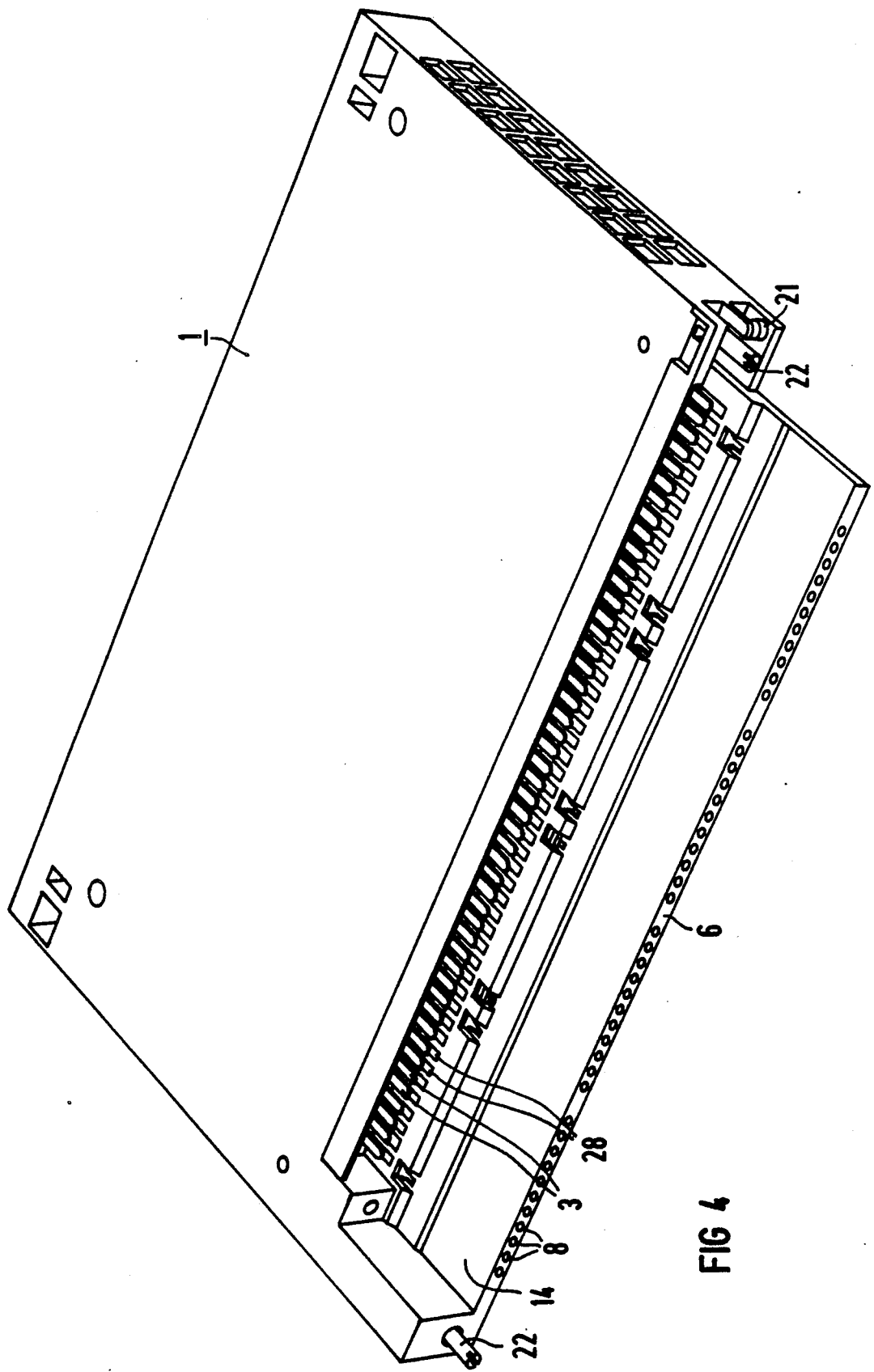
FIG. 4 is a perspective view of the module without the front panel connector constructed according to the embodiment of the present invention illustrated in FIG. 1.

In FIG. 4, a perspective view of the module without the front panel connector is provided. The module 1 is secured via threaded bolts 22 to a PCB rack which is not shown. The connecting terminals 3 project out of the slits 28 in the bar 14, for which slit openings are also provided on the reverse side of the front panel connector 2 by way of which cables in the cable channel 5 of the front panel connector 2 can be electrically connected to these connecting terminals 3.

The front panel connector 2 is swivelled onto the housing of the module 1 via the swivel mount 26, in FIG. 5, which is adapted to the swivel bearing 21 of the module 1. To secure the front panel connector 2 to the housing shell 11, this housing shell has an anchoring bolt 29 which can be operated from the front side of the module. Cables within the cable channel 5 of the front panel connector 2 are accessible through the front door 4. The front door 4 is secured in a foldable manner via the flexible hinge 23 on the front panel connector 2, and on the front side which is visible when closed, it has an insertable label 30 with labelling fields which are assigned by the fiber optic guides 8 to the adjacent luminous displays. The label 30 is visible on part of the closed front door 4.

FIG. 5 illustrates a partial view of the front panel connector 2 with its swivel mount 26, into which a coding element 24 is able to be inserted. Front panel connectors 2 which are provided with this coding element 24 can only be swivelled onto mechanically, corresponding adapted housings of modules 1. An erroneously false connection of such front panel connectors 2 onto inappropriate modules 1 can thus be avoided with the coding element 24.

The above-described module 1 displays its status and distinguishes itself in particular by a simple design and its manufacture in rectilinear progressions which make possible an automated manufacture. By way of the measures described above, a particularly narrow module is created which takes up little space. Furthermore, the narrow module overcomes the disadvantages associated with other electronic modules regarding door damage and obstruction to the door.

What is claimed is:

1. A module comprising:
    a front fin;
    a printed circuit board having connecting terminals;
    a status display disposed on a front side of a front-sided fin, said status display comprising:
        a plurality of light emitting elements; and
        a plurality of fiber optic guides which lead into the fin, said fiber optic guides serving as extension elements of said plurality of light-emitting elements to display status;
    a front panel connector including a cable channel receiving cables which are able to electrically connected to leads on the printed circuit board via the connecting terminals; and
    a front door attached to said front panel connector.

2. The module according to claim 1, further comprising threaded bolts useful for attaching the module to a printed circuit board rack.

3. The module according to claim 1, wherein a front panel connector further comprises a coding element.

4. The module according to claim 1, further comprising a flexible hinge securing said front door to said front panel connector.

5. The module according to claim 1, wherein said light-emitting elements comprise light-emitting diodes.

6. The module according to claim 5, further comprising retainers, including a first flexible hinge, mounting the light-emitting diodes at a first end of said plurality of optic guides.

7. The module according to claim 1, wherein said module further comprises:
   a housing shell, said housing shell including means for positioning the printed circuit board; and
   a housing cover.

8. The module according to claim 7, wherein said fin comprises a bar on said housing shell which projects to the front side and a counterpart bar on said housing cover.

9. The module according to claim 8, further comprising threaded bolts useful for attaching the module to a printed circuit board rack.

10. The module according to claim 1, wherein said front panel connector includes a swivel mount which is adapted to the swivel bearing of said housing shell.

11. The module according to claim 10, wherein a front panel connector further comprises a coding element.

12. The module according to claim 11, further comprising a swivel mount disposed on said front panel connector, wherein said coding element is inserted in the region of said swivel mount.

13. The module according to claim 10, further comprising a second flexible hinge securing said front door to said front panel connector.

14. The module according to claim 1, wherein several of said plurality of fiber optic guides are combined into one fiber optic comb.

15. The module according to claim 14, wherein said front panel connector includes a swivel mount which is adapted to the swivel bearing of said housing shell.

16. The module according to claim 14, further comprising a latching mechanism to secure said fiber optic comb into place in said shell.

17. The module according to claim 14, wherein said light-emitting elements comprise light-emitting diodes.

18. The module according to claim 17, further comprising retainers, including a first flexible hinge, mounting the light-emitting diodes at a first end of said plurality of optic guides.

19. The module according to claim 15, wherein a front panel connector further comprises a coding element.

20. The module according to claim 15, further comprising a second flexible hinge securing said front door to said front panel connector.

* * * * *